(12) United States Patent
Okahiro

(10) Patent No.: US 8,804,446 B2
(45) Date of Patent: Aug. 12, 2014

(54) SEMICONDUCTOR DEVICE HAVING EQUALIZING CIRCUIT EQUALIZING PAIR OF BIT LINES

(75) Inventor: Tetsuaki Okahiro, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 222 days.

(21) Appl. No.: 13/280,949

(22) Filed: Oct. 25, 2011

(65) Prior Publication Data

US 2012/0120751 A1     May 17, 2012

(30) Foreign Application Priority Data

Nov. 11, 2010   (JP) ................................. 2010-252679

(51) Int. Cl.
    *G11C 7/00*     (2006.01)
(52) U.S. Cl.
    USPC ....................... 365/207; 365/203; 365/230.06
(58) Field of Classification Search
    USPC ..................................... 365/207, 203, 230.06
    See application file for complete search history.

(56) References Cited

U.S. PATENT DOCUMENTS

| | | | |
|---|---|---|---|
| 6,366,507 B1 | 4/2002 | Akioka et al. | |
| 6,373,763 B1 | 4/2002 | Taito et al. | |
| 6,538,933 B2 | 3/2003 | Akioka et al. | |
| 6,930,952 B2 * | 8/2005 | Kim | 365/230.06 |
| 7,245,542 B2 * | 7/2007 | Park et al. | 365/201 |
| 7,684,270 B2 * | 3/2010 | Hirota et al. | 365/202 |
| 2002/0051393 A1 | 5/2002 | Taito et al. | |
| 2002/0089881 A1 | 7/2002 | Akioka et al. | |

FOREIGN PATENT DOCUMENTS

| | | |
|---|---|---|
| JP | H7-302495 A | 11/1995 |
| JP | H11-213669 A | 8/1999 |
| JP | 2000-036193 A | 2/2000 |
| JP | 2000-163960 A | 6/2000 |
| JP | 2001-101868 A | 4/2001 |
| JP | 2002-15578 A | 1/2002 |
| JP | 2002-133869 A | 5/2002 |
| JP | 2003-132679 A | 5/2003 |

* cited by examiner

*Primary Examiner* — Son Dinh
(74) *Attorney, Agent, or Firm* — Sughrue Mion, PLLC

(57) ABSTRACT

A semiconductor device includes: a sense amplifier including an equalizing circuit that equalizes a pair of bit lines; an equalizing control circuit that converts the amplitude of an equalizing signal into a VDD level, and a word driver that controls a sub word line based on a timing signal. The word driver includes a level shift circuit for changing the operation timing of the sub word line in accordance with the VDD level, allowing a timing to complete the equalizing operation and a timing to reset the sub word line to synchronize even when the level of the VDD level is changed.

20 Claims, 9 Drawing Sheets

SEMICONDUCTOR DEVICE HAVING EQUALIZING CIRCUIT EQUALIZING PAIR OF BIT LINES

BACKGROUND OF THE INVENTION

1. Field of the Invention

The present invention relates to a semiconductor device and more particularly relates to a semiconductor device in which an equalizing circuit is provided in a sense amplifier.

2. Description of Related Art

As generally known, data stored in a semiconductor memory device such as a DRAM (Dynamic Random Access Memory) is read by amplifying a potential difference appeared at a pair of bit lines through read operation. To perform sense operation, it is necessary to precharge the pair of bit lines to the same potential and, in general, a bit line driven to high potential (VARY) and a bit line driven to low potential (VSS) are short-circuited using an equalizing circuit to perform the precharge operation. In this case, the precharge level is set to intermediate potential (VBLP) between the VARY and VSS.

In recent years, the internal voltage of a semiconductor device is lowered for reduction of power consumption. Thus, when a pair of bit lines are short-circuited using an equalizing circuit, the gate-source and gate-drain voltages of a transistor constituting the equalizing circuit become small, resulting in much time being required in the equalizing operation. For example, assuming that the internal potential VPERI is 1.0 V and precharge level VBLP is 0.5 V, the gate-source voltage (VPERI-VBLP) of a transistor constituting the equalizing circuit is 0.5 V. That is, it is difficult to ensure sufficient ON-current.

In order to solve the above problem, there can be considered a method of driving the transistor constituting the equalizing circuit with higher potential as disclosed in Japanese Patent Application Laid-Open No. 2003-132679.

However, in a semiconductor device disclosed in Japanese Patent Application Laid-Open No. 2003-132679, a boost potential is used as an equalizing signal is generated. Using the boost potential poses a problem in increases in not only circuit scale but also power consumption. In order to suppress these increases, there is a method of directly using an external potential VDD as the equalizing signal is generated. In this case, however, the timing of the equalizing signal is changed depending on the voltage condition of the external potential VDD. As a result, it becomes difficult to adjust a timing between a signal to control a word line, which is controlled by internal potential and thus relatively less influenced by the voltage condition of the external potential VDD, and a equalizing signal. In some cases, equalizing operation may erroneously start before reset of the word line.

SUMMARY

In one embodiment, there is provided a semiconductor device that includes: a memory cell array including a plurality of bit lines having at least a pair of bit lines, a plurality of sub word lines, and a plurality of memory cells disposed at intersections of the bit lines and the sub word lines; a sense amplifier including a first drive circuit that drives one of the pair of bit lines to a first potential, a second drive circuit that drives other one of the pair of bit lines to a second potential higher than the first potential, and an equalizing circuit that equalizes the pair of bit lines to substantially a same potential; a timing control circuit that generates an equalizing signal and a timing signal having an amplitude ranging from the first potential to a third potential higher than the first potential; an equalizing control circuit that converts a level of the equalizing signal into a fourth potential higher than the second and third potentials and supplies the equalizing signal having the fourth potential to the equalizing circuit; and a word driver that controls the sub word lines based on the timing signal, wherein the word driver including a timing adjustment circuit that changes an operation timing of the sub word lines in accordance with a level of the fourth potential.

In another embodiment, there is provided a device that includes: a terminal supplied with a first voltage from outside of the device, first and second bit lines; a word line; an equalizing circuit coupled between the first and second bit lines and including a control node, the equalizing circuit connecting the first and second bit lines to each other when the first voltage is supplied to the control node thereof, and a word line drive circuit that drives the word line, the word line drive circuit including a first circuit section that operates on the first voltage.

In still another embodiment, there is provided a device that includes: first and second bit lines; a word line; an amplifier circuit coupled between the first and second bit lines and driving, when activated, one of the first and second bit lines to a first voltage and the other of the first and second bit lines to a second voltage higher than the first voltage; a first control circuit operating on a third voltage that is higher than the second voltage and generating an equalizing signal taking one of the first voltage and the third voltage; an equalizing circuit coupled between the first and second bit lines and including a control node receiving the equalizing signal, the equalizing circuit disconnecting the first and second bit lines from each other when the equalizing signal takes the first voltage and connecting the first and second bit lines to each other when the equalizing signal takes the third voltage; and a word line drive unit activating or deactivating the word line, the word line drive unit deactivating the word line at a timing depending on a variation of the third voltage.

According to the present invention, the operation timing of the sub word line is changed in accordance with the level of the equalizing signal, so that even when the level of the equalizing signal is changed, the timing to complete the equalizing operation the timing to reset the sub-word line can be made to occur at the same time. As a result, it is possible to use potential like external potential (VDD) whose level can be changed as the equalizing signal without modification and, in this case, a booster circuit for the equalizing signal need not be provided.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
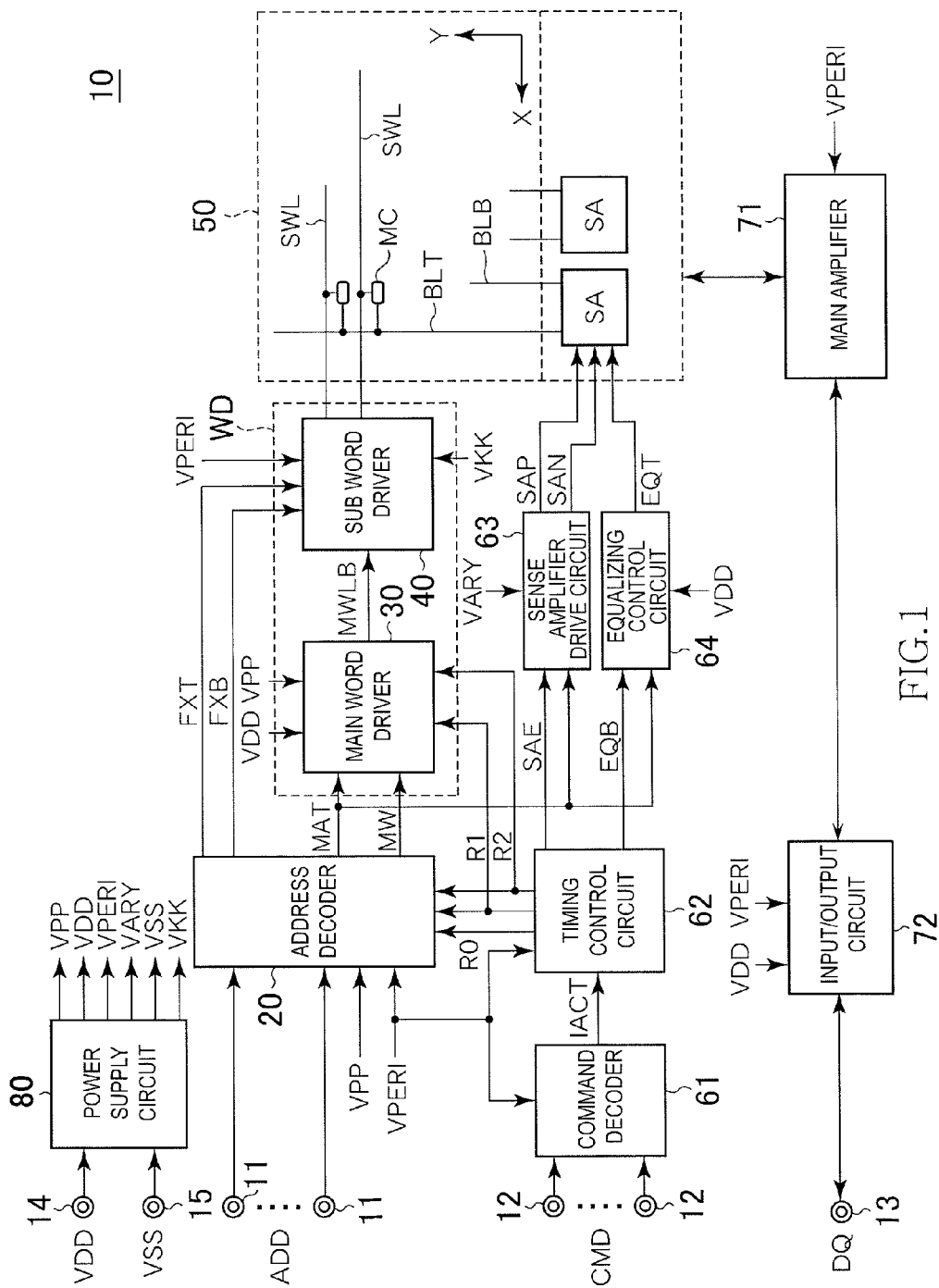
FIG. 1 is a block diagram illustrating a configuration of a semiconductor device according to a preferred embodiment of the present invention.

FIG. 1 is a block diagram illustrating a configuration of a semiconductor device according to a preferred embodiment of the present invention. FIG. 1 mainly illustrates a row system access circuit part, and a column system access circuit part is omitted.

As illustrated in FIG. 1, a semiconductor device 10 according to the present embodiment has, as external terminals, an address terminal 11, a command terminal 12, a data terminal 13, and power supply terminals 14 and 15.

The address terminal 11 is a terminal to which an address signal ADD is externally supplied, and the input address signal ADD is supplied to an address decoder 20. The address decoder 20 is a circuit for predecoding the address signal ADD. The address decoder 20 outputs a signal as a result of decoding a part of the address signal ADD as a mat selection signal MAT, outputs a signal as a result of decoding another part of the address signal ADD as a main word line selection signal MW, and outputs a signal as a result of decoding still another part of the address signal ADD as sub-word line selection signals FXT and FXB. The mat selection signal MAT and main word line selection signal MW are supplied to a main word driver 30, and sub-word line selection signals FXT and FXB are supplied to a sub word driver 40. The mat selection signal MAT is supplied also to a sense amplifier drive circuit 63 and an equalizing control circuit 64. In the present invention, the main word driver 30 and sub word driver 40 are sometimes collectively referred to merely as "word driver WD".

The main word driver 30 is a circuit for generating a main word signal MWLB based on the mat selection signal MAT and main word line selection signal MW. The sub word driver 40 is a circuit for driving a sub word line SWL based on the sub word line selection signals FXT and FXB and main word signal MWLB.

A plurality of sub word lines SWL extend in X-direction in a memory cell array 50, and a plurality of bit lines BL extend in Y-direction in the memory cell array 50. A memory cell MC is disposed at each intersection of the sub word lines SWL and bit lines BL. In a plurality of the bit lines BL, a bit line BLT and a bit line BLB, forming a pair, are connected to a corresponding sense amplifier SA, respectively. The sense amplifier SA is a circuit for amplifying a potential difference generated in each of the bit lines BLT and BLB.

The command terminal 12 is a terminal to which a command signal CMD is input. The input command signal CMD is supplied to a command decoder 61. The command decoder 61 is a circuit for generating various internal commands based on the command signal CMD. In FIG. 1, an internal active command IACT is illustrated as one of the various internal commands. The internal active command IACT is activated in the case where the command signal CMD indicates an active command.

The internal active command IACT is supplied to a timing control circuit 62. The timing control circuit 62 is for activating timing signals R0, R1, and R2 in this order in response to the internal active command IACT, as well as, activating a sense enable signal SAE and an equalizing signal EQB in this order. The timing signals R0, R1, and R2 are supplied to the address decoder 20 and main word driver 30 so as to specify the operation timing of these circuits. The sense enable signal SAE is supplied to the sense amplifier drive circuit 63, and equalizing signal EQB is supplied to the equalizing control circuit 64.

The sense amplifier drive circuit 63 is for outputting sense amplifier drive signals SAP and SAN in response to the sense enable signal SAE. The sense amplifier drive signals SAP and SAN are drive signals for activating the sense amplifier SA. The equalizing control circuit 64 is for outputting an equalizing signal EQT in response to the equalizing signal EQB. The equalizing signal EQT is for executing equalizing operation that makes the potentials of the paired bit lines BLT and BLB of a plurality of the bit lines BL substantially the same. As described later, the equalizing signal EQT is level-converted for the equalizing signal EQB.

Read data amplified by the sense amplifier SA is supplied to an input/output circuit 72 through a main amplifier 71. The main amplifier 71 has a function of amplifying read data having an amplitude ranging from VSS potential (first potential) to VARY potential (second potential) to convert the amplitude of the read data into an amplitude ranging from VSS potential (first potential) to VPERI potential (third potential). The input/output circuit 72 has a function of further amplifying the read data having an amplitude ranging from VSS potential (first potential) to VPERI potential (third potential) to convert the amplitude of the read data, which is amplified by the main amplifier 71, into an amplitude ranging from VSS potential (first potential) to VDD potential (fourth potential).

The above potentials are generated by a power supply circuit 80. The power supply circuit 80 is connected to the power supply terminal 14 to which the VDD potential is supplied and power supply circuit 15 to which the VSS potential is supplied, and generates various internal potentials based on the VDD and VSS potentials. The internal potentials generated by the power supply circuit 80 include, in addition to the VARY potential (second potential) and VPERI potential (third potential), VPP potential (fifth potential) and VKK potential (sixth potential). The VDD potential (fourth potential) and VSS potential (first potential) supplied from the power supply terminals 14 and 15 are also output from the power supply circuit 80. The relationship among the above potentials is represented as follows:

VKK<VSS<VARY≈VPERI<VDD<VPP.

Therefore, the VARY and VPERI are generated by reducing the VDD potential, while the VPP is generated by increasing the VDD potential. The VKK is generated by increasing the VSS voltage in the negative direction.

The VDD of the above potentials is external potential and can thus change. Besides, in a wide-range product in which available VDD level range is wide, the level itself of the VDD externally given is changed depending on a use situation. The VSS is also external potential; however, the level of the VSS is generally set to the ground level and is thus hardly changed.

The potentials output from the power supply circuit 80 are supplied to their corresponding circuit blocks. Concretely, the VPERI potential is supplied to the most of peripheral circuits such as the address decoder 20, the command decoder 61, the timing control circuit 62, and the main amplifier 71, and these circuit blocks operate using voltage between the VPERI potential and VSS potential as a power supply. Thus, the amplitude of the signals which these circuit blocks input and output ranges from the VSS potential to VPERI potential.

On the other hand, the VARY, VDD, or VPP potential is supplied to some circuits together with or in place of the VPERI potential. For example, not only the VPERI potential but also VPP potential is supplied to the address decoder 20, VDD potential and VPP potential are supplied to the main word driver 30, and VKK potential is supplied to the sub word driver 40. The VARY potential is supplied to the sense amplifier drive circuit 63, and VDD potential is supplied to the equalizing control circuit 64.

Figure 2:
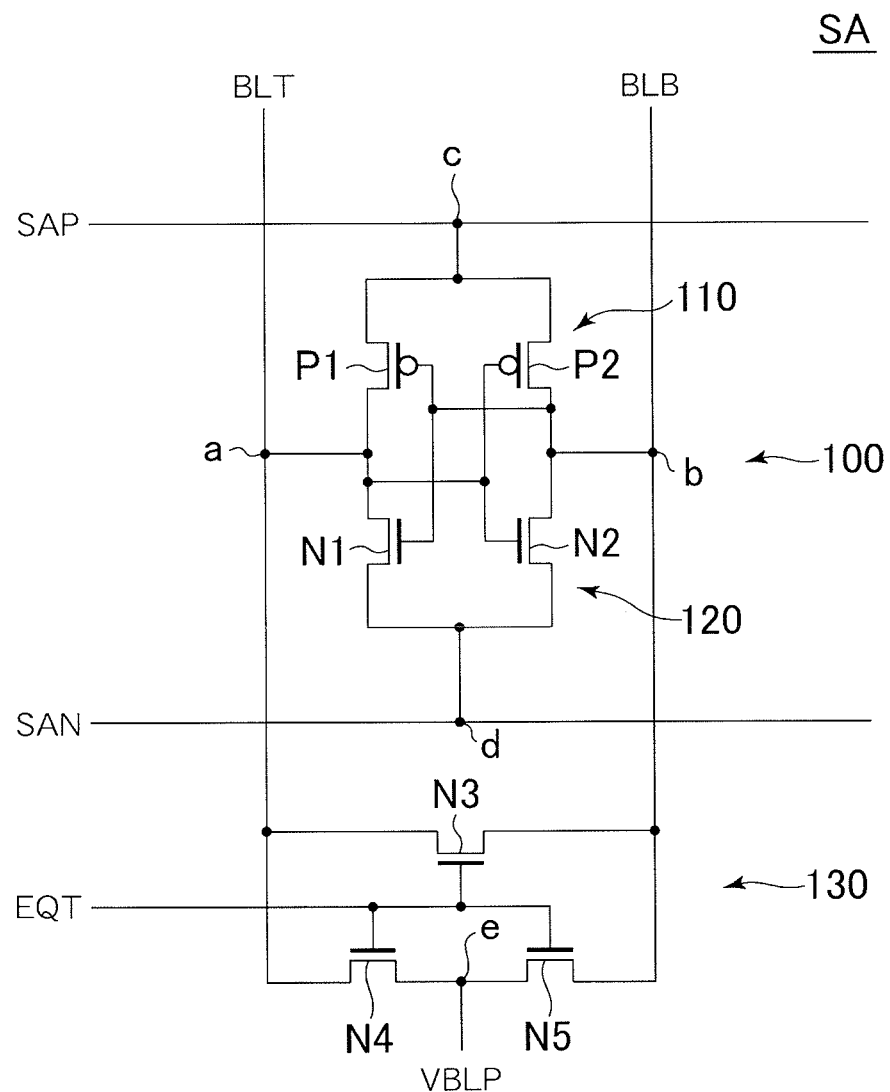
FIG. 2 is a circuit diagram of a sense amplifier SA.

FIG. 2 is a circuit diagram of the sense amplifier SA.

As illustrated in FIG. 2, the sense amplifier SA includes a flip-flop circuit 100 in which a pair of input/output nodes a and b are connected to the bit lines BLT and BLB, respectively, and an equalizing circuit 130 for equalizing the bit lines BLT and BLB to the same potential. The flip-flop circuit 100 has a drive circuit 110 composed of cross-coupled P-channel type MOS transistors P1, P2 and a drive circuit 120 composed of cross-coupled N-channel type MOS transistors N1, N2.

The sense amplifier drive signal SAP is supplied to a common source c of the drive circuit 110, and sense amplifier drive signal SAN is supplied to a common source d of the drive circuit 120. The sense amplifier drive signal SAP has the VARY potential at its activation time, and sense amplifier drive signal SAN has the VSS potential at its activation time. Thus, the drive circuit 110 drives one of the bit lines BLT and BLB to the VARY potential, and drive circuit 120 drives the other one of the bit lines BLT and BLB to the VSS potential.

The equalizing circuit 130 has an N-channel type MOS transistor N3 connected between the bit lines BLT and BLB and N-channel type MOS transistors N4 and N5 connected in series between the bit lines BLT and BLB. The equalizing signal EQT is supplied to the gate electrodes of the transistors N3 to N5. The intermediate potential VBLP is supplied to a connection point e of the transistors N4 and N5. The intermediate potential VBLP is intermediate potential between the VARY potential and VSS potential. Thus, when the equalizing signal EQT is activated to a high level, the bit lines BLT and BLB are equalized to the intermediate potential VBLP.

Figure 3:
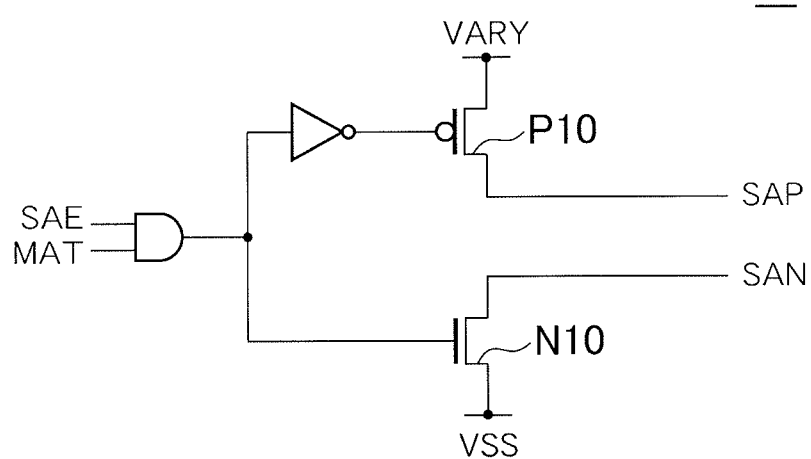
FIG. 3 is a circuit diagram of a sense amplifier drive circuit 63.

FIG. 3 is a circuit diagram of the sense amplifier drive circuit 63.

As illustrated in FIG. 3, the sense amplifier drive circuit 63 includes a P-channel type MOS transistor P10 and an N-channel-type MOS transistor N10 which are conducted in response to activation of both the sense enable signal SAE and mat selection signal MAT to a high level. The VARY potential is supplied to the source of the transistor P10, and VSS potential is supplied to the source of the transistor N10. Thus, when the transistors P10 and N10 are turned ON by the sense enable signal SAE, the sense amplifier drive signals SAP and SAN are driven to the VARY potential and VSS potential, respectively.

Figure 4:
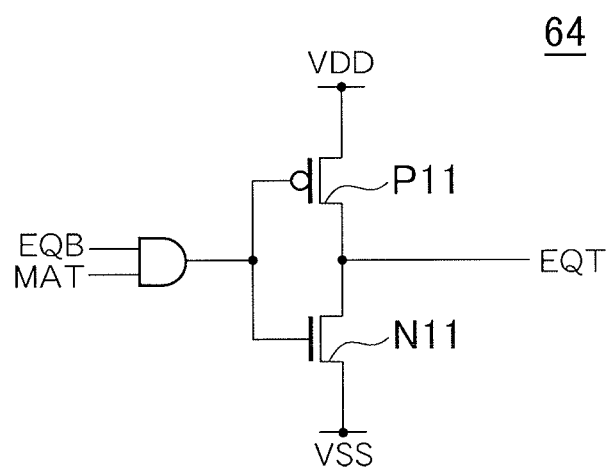
FIG. 4 is a circuit diagram of a equalizing control circuit 64.

FIG. 4 is a circuit diagram of the equalizing control circuit 64.

As illustrated in FIG. 4, the equalizing control circuit 64 is an inverter circuit including a P-channel type MOS transistor P11 and an N-channel type MOS transistor N11. The VDD potential is supplied to the source of the transistor P11, and VSS potential is supplied to the source of the transistor N11. Thus, when one of the equalizing signal EQB and mat selection signal MAT is at a low level, the equalizing signal EQT which is the output of the equalizing control circuit 64 has the VDD potential. The timing control circuit 62 which generates the equalizing signal EQB uses the VPERI potential as a power supply, as described above, and thus has an amplitude ranging from the VSS to VPERI, while the amplitude of the equalizing signal EQT is increased to an amplitude ranging from the VSS to VDD. That is, the equalizing control circuit 64 functions as a level conversion circuit for converting the level of the equalizing signal EQB.

The reason for converting the level of the equalizing signal EQB using the equalizing control circuit 64 is to improve the characteristics of the equalizing circuit 130 illustrated in FIG. 2. That is, when the amplitude of the equalizing signal EQT ranges from the VSS to VPERI, the gate-source voltages of the transistors N3 to N5 are restricted to "VPERI-VBLP", thereby not enabling to ensure sufficient ON-current if the VPERI potential is low. On the other hand, if the amplitude of the equalizing signal EQT is increased to the VDD, the gate-source voltages of the transistors N3 to N5 are increased to "VDD-VBLP" to increase ON-current, thereby allowing the equalizing operation to be executed at high speed.

Figure 5:
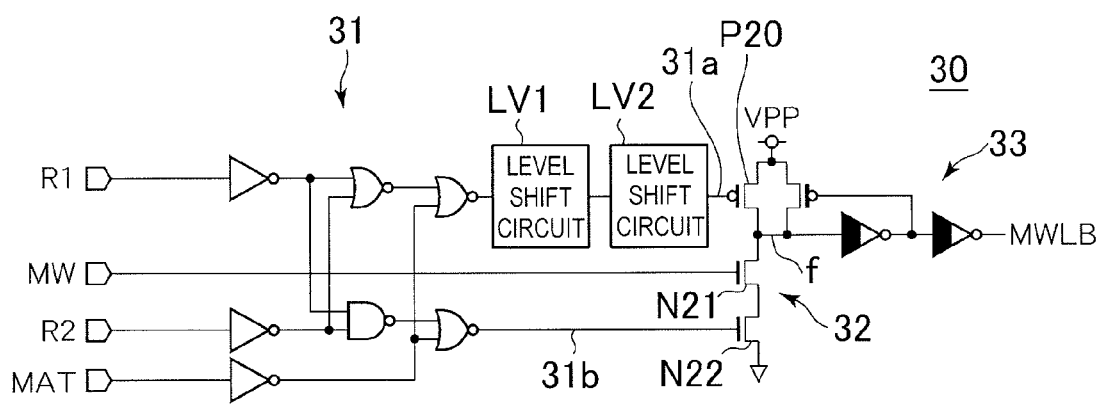
FIG. 5 is a circuit diagram of a main word driver 30.

FIG. 5 is a circuit diagram of the main word driver 30.

As illustrated in FIG. 5, the main word driver 30 has a logic circuit 31 that receives the timing signals R1 and R2 and mat selection signal MAT, a selection circuit 32 precharged by an output signal 31a of the logic circuit 31 and discharged by an output signal 31b of the logic circuit 31 and main word line selection signal MW, and an output circuit 33 for latching the output of the selection circuit 32 and outputting a signal as the main word signal MWLB.

The logic circuit 31 puts the output signal 31a in a low level when the mat selection signal MAT is activated to a high level while both the timing signals R1 and R2 are at a high level, thereby turning ON a P-channel type MOS transistor P20 included in the selection circuit 32. Since the VPP potential is supplied to the source of the transistor P20, an internal node f is precharged to the VPP potential when the transistor P20 is turned ON. After that, when at least one of the timing signals R1 and R2 is changed to a low level, the transistor P20 is put in an OFF state. When the main word line selection signal MW is changed to a high level and both the timing signals R1 and R2 are changed to a low level in the OFF state of the transistor P20, both N-channel type MOS transistors N21 and N22 included in the selection circuit 32 are tuned ON, so that the internal node f is discharged to the VSS level. As a result, the main word signal MWLB output from the output circuit 33 is activated to the VSS potential. If the main word line selection signal MW is kept in a low level, the internal node f is kept in the VPP level, so that the main word signal MWLB is kept in a non-activated state with the VPP potential.

Two level shift circuits LV1 and LV2 are provided in a signal path of the output signal 31a output from the logic circuit 31. The level shift circuit LV1 is for increasing the amplitude of the output signal 31a ranging from the VSS to VPERI to an amplitude ranging from the VSS to VDD, and level shift circuit LV2 is for increasing the amplitude of the output of the level shift circuit LV1 to an amplitude ranging from the VSS to VPP. With this configuration, the output signal 31a having an amplitude ranging from the VSS to VPP is supplied to the gate electrode of the transistor P20. The level shift circuit LV1 is a dummy circuit functioning as a timing adjustment section and is inserted for giving a VDD dependency to the signal waveform of the output signal 31a. The reason for this is that since the equalizing signal EQT has the VDD dependency, it is necessary to give the same VDD dependency to the main word signal MWLB.

As described above, the mat selection signal MAT and main word line selection signal MW are signals obtained by decoding a part of the address signal ADD, so that the main word signal MWLB is activated to the VSS potential when the address signal ADD is set to a predetermined value. A number of circuits illustrated in FIG. 5 corresponding to the number of signal lines for the main word signal MWLB are provided in the main word driver 30.

Figure 6:
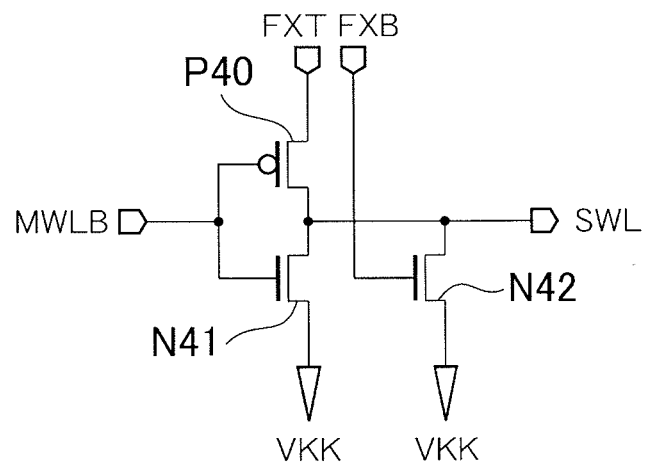
FIG. 6 is a circuit diagram of a sub word driver 40.

FIG. 6 is a circuit diagram of the sub word driver 40.

As illustrated in FIG. 6, the sub word driver 40 is constituted by a P-channel type MOS transistor P40 and N-channel type MOS transistors N41, N42 the drains of which are connected to the sub word line SWL. The sub word line selection signal FXT is supplied to the source of the transistor P40, and VKK potential is supplied to the sources of the transistors N41, N42. The main word signal MWLB is supplied to the gates of the transistors P40 and N41, and sub word line selection signal FXB is supplied to the gate of the transistor N42. The sub word line selection signals FXT, FXB each have an amplitude ranging from the VSS to VPP and transit in synchronization with the timing signals R0 and R1, respectively.

With the above configuration, when the main word signal MWLB is activated to a low level (VSS) while the sub word line selection signals FXT and FXB assume the VPP potential and VSS potential, respectively, the sub word line SWL is driven to the VPP potential through the transistor P40. As a result, from the memory cell MC connected to the sub word line SWL, read data is read through its corresponding bit line BLT or BLB. On the other hand, when the main word signal MWLB is inactivated to a high level (VPP), the sub word line SWL is inactivated to the VKK potential by the transistor N41 even if the sub word line selection signals FXT and FXB assume the VPP potential and VSS potential, respectively.

Since the sub word line selection signals FXT and FXB each obtained by decoding a part of the address signal ADD as described above, the sub word line SWL is driven to the VPP potential only when the address signal ADD is set to a predetermined value. The number of circuits illustrated in FIG. 6 corresponding to the number of the sub word lines SWL are provided in the sub word driver 40.

Figure 7:
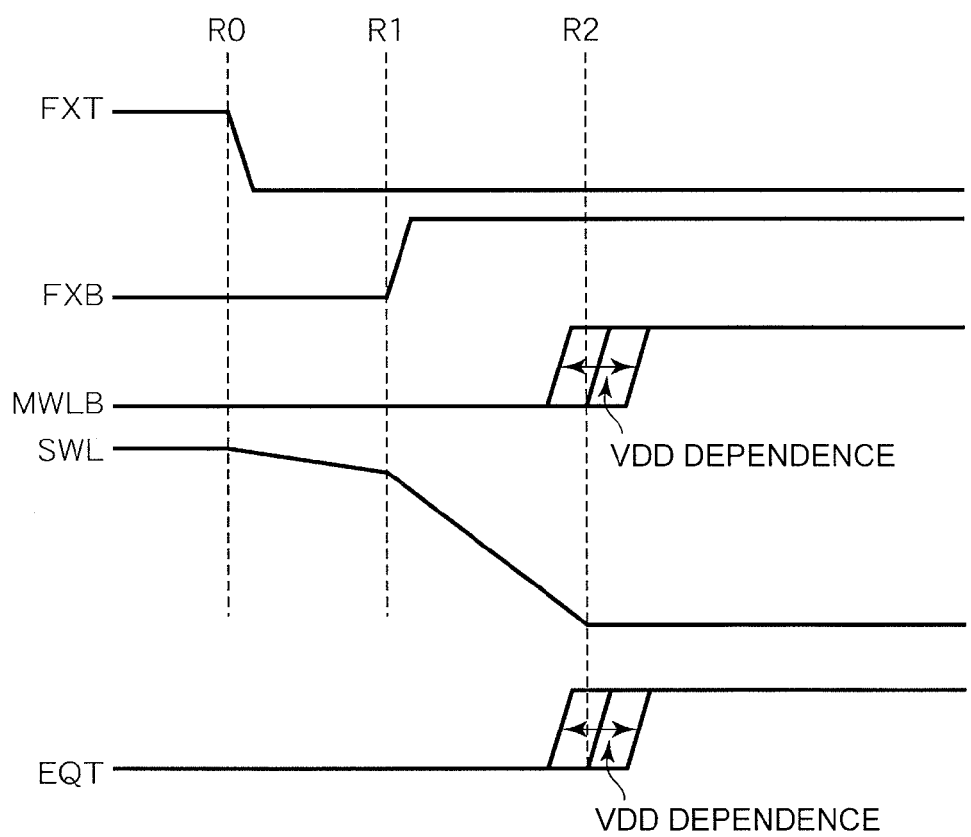
FIG. 7 is a timing chart for explaining operation of a semiconductor device 10.

FIG. 7 is a timing chart for explaining operation of the semiconductor device 10 according to the present embodiment, which illustrates operation when the sub word line SWL is reset.

In the example of FIG. 7, the sub word line selection signal FXT is changed to a low level in synchronization with the transition of the timing signal R0, while the sub word line selection signal FXB is changed to a high level in synchronization with the transition of the timing signal R1. At this time point, the main word signal MWLB is still activated to a low level. Thus, when the sub word line selection signal FXT is changed to a low level, the potential supplied to the sub word line SWL through the transistor P40 of FIG. 6 is changed from the VPP potential to VSS potential. As a result, the potential of the sub word line SWL starts decreasing from the VPP level. As the potential of the sub word line SWL is decreased depending on charge drawing through the P-channel type MOS transistor, the potential decrease of the sub word line SWL is relatively gradual.

When the sub word line selection signal FXB is changed to a high level, the transistor N42 of FIG. 6 is turned ON, so that the potential of the sub word line SWL is decreased further toward the VKK level. Then, when the main word signal MWLB is changed to a high level in synchronization with the transition of the timing signal R2, the transistor P40 is turned OFF, so that the potential of the sub word line SWL is driven to the VKK level by the transistors N41 and N42. As described above, in the present embodiment, reset of the sub word line SWL is executed in two stages: from VPP to VSS; and from VSS to VKK, thereby preventing a change of a threshold value or an increase in off-leak current due to hot carrier degradation.

It is necessary to synchronize the equalizing signal EQT and main word signal MWLB. The reason is because that data of the memory cell MC may be destroyed if the equalizing operation is started before the sub word line SWL has completely been reset to the VKK level. And the reason is because that it is necessary to avoid such a problem by starting the equalizing operation in synchronization with the reset of the main word signal MWLB performed at the last stage of the reset operation of the sub word line SWL.

The equalizing control circuit 64 for generating the equalizing signal EQT uses the VDD potential, so that when a change occurs in the power supply potential VDD supplied to the power supply terminal 14 from outside, the timing at which the equalizing signal EQT is activated is also changed. Further, in a wide-range product in a product in which a range of available power supply potential is wide such as a wide-range product, the timing at which the equalizing signal EQT is activated is significantly changed depending on the level of the power supply potential VDD actually used. In the case where the activation timing of the equalizing signal EQT is changed in accordance with the VDD potential and where the reset timing of the main word signal MWLB is not subject to the influence of the change in the VDD potential, the equalizing operation is started before the sub word line SWL has been reset to a threshold voltage of the memory cell transistor, so that data of the memory cell MC may be destroyed. However, in the present embodiment, when the activation timing is changed depending on the VDD potential, the reset timing of the main word signal MWLB is also changed in the same direction due to intervention of the level shift circuit LV1. That is, under the condition where the activation timing of the equalizing signal EQT comes earlier due to high VDD potential, the reset timing of the main word signal MWLB also comes earlier and, conversely, under the condition where the activation timing of the equalizing signal EQT comes later due to low VDD potential, the reset timing of the main word signal MWLB also comes later. As a result, it is possible to prevent a failure that the order between the activation timing of the equalizing signal EQT and the reset timing of the main word signal MWLB is reversed due to a change in the VDD potential even though the amplitude of the equalizing signal EQT is increased to the VDD level.

Figure 8:
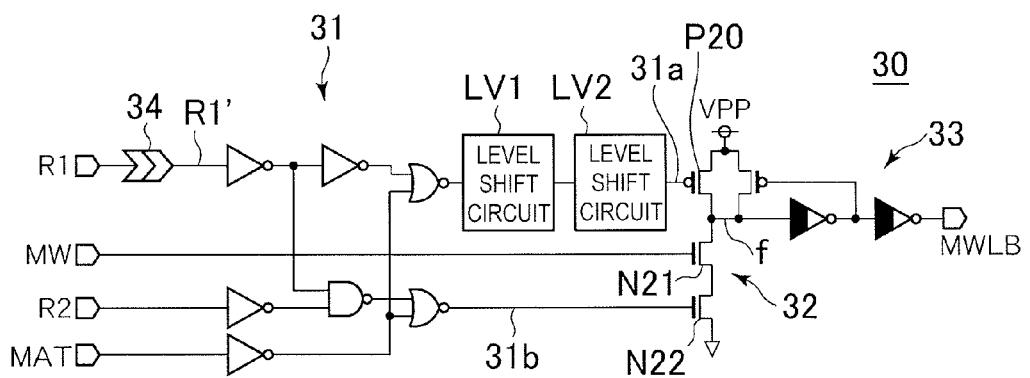
FIG. 8 is a circuit diagram of the main word driver 30 according to a second embodiment.

FIG. 8 is a circuit diagram of the main word driver 30 according to a second embodiment.

As illustrated in FIG. 8, in the present embodiment, the logic of the logic circuit 31 included in the main word driver 30 is altered. Concretely, the logic for generating the output signal 31a is altered, and the output signal 31a is generated based on the mat selection signal MAT and timing signal R1. That is, in the case where the mat selection signal MAT is at a high level, the output signal 31a is at a low level if the timing signal R1 is at a high level while is at a high level if the timing signal R1 is at a low level.

Further, in the main word driver 30 illustrated in FIG. 8, a rise delay circuit 34 for delaying the rising edge is added to a signal path for the timing signal R1. The rise delay circuit 34 delays only the rising edge of the timing signal R1 and does not substantially delay the falling edge of the timing signal R1. With this configuration, when the timing signal R1 transits from a low level to high level, a timing signal R1' transits from a low level to high level after elapse of delay time by the rise delay circuit 34, so that the P-channel type MOS transistor P20 is turned ON.

Figure 9:
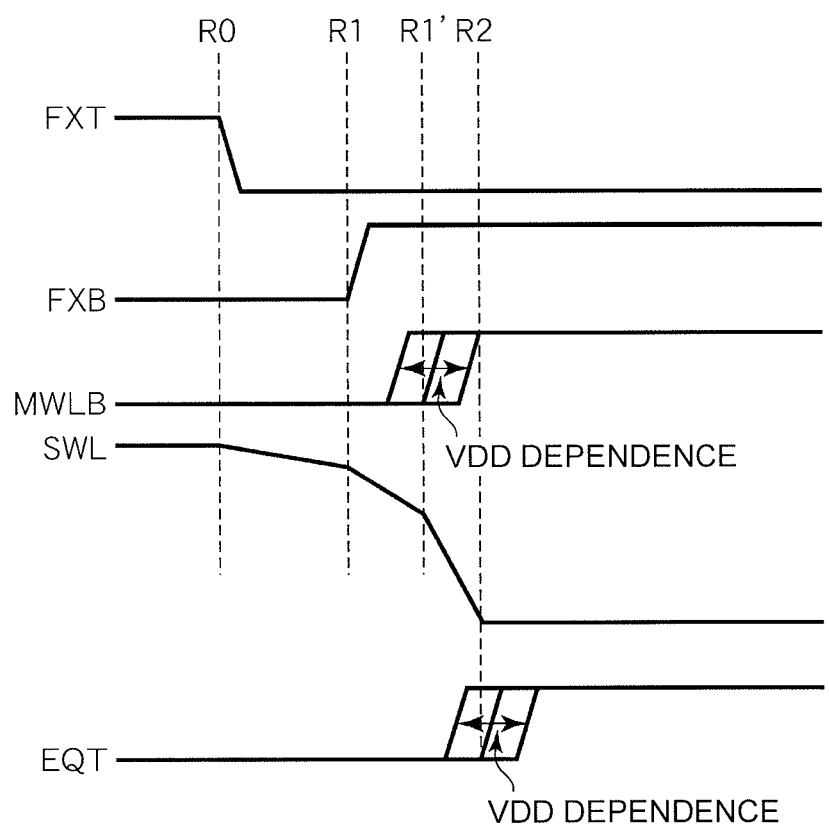
FIG. 9 is a timing chart for explaining operation of the main word driver 30 of FIG. 8.

FIG. 9 is a timing chart for explaining operation of the main word driver 30 of FIG. 8, which illustrates operation when the sub word line SWL is reset.

The operation illustrated in FIG. 9 is the same as that of FIG. 7 except for the timing at which the main word signal MWLB is reset. Upon transition of the timing signal R0, the potential to be supplied to the sub word line SWL is changed from the VPP potential to VSS potential and, upon transition of the timing signal R1, the potential of the sub word line SWL is decreased further toward the VKK level. Then, upon transition of the timing signal R1' delayed by the rise delay circuit 34, the transistor P40 is turned OFF, so that the potential of the sub word line SWL is driven to the VKK level by the transistors N41 and N42. After that, in the wake of the transition of the timing signal R2, the equalizing signal EQT is activated.

As described above, in the present embodiment, the reset timing of the main word signal MWLB is made earlier, so that the timing at which the transistor N41 is turned ON is earlier than in the example of FIG. 7, allowing the reset of the sub word line SWL to be executed at high speed. In addition, the reset timing of the main word signal MWLB inevitably occurs later than the transition of the timing signal R1, thereby preventing occurrence of hot carrier degradation caused by erroneously resetting the main word signal MWLB earlier.

It is apparent that the present invention is not limited to the above embodiments, but may be modified and changed without departing from the scope and spirit of the invention.

What is claimed is:

1. A semiconductor device comprising:
a memory cell array including a plurality of bit lines having at least a pair of bit lines, a plurality of sub word lines, and a plurality of memory cells disposed at intersections of the bit lines and the sub word lines;
a sense amplifier including a first drive circuit that drives one of the pair of bit lines to a first potential, a second drive circuit that drives other one of the pair of bit lines to a second potential higher than the first potential, and an equalizing circuit that equalizes the pair of bit lines to substantially a same potential;
a timing control circuit that generates an equalizing signal and a timing signal having an amplitude ranging from the first potential to a third potential higher than the first potential;
an equalizing control circuit that converts a level of the equalizing signal into a fourth potential higher than the second and third potentials and supplies the equalizing signal having the fourth potential to the equalizing circuit; and
a word driver that controls the sub word lines based on the timing signal,
wherein the word driver including a timing adjustment circuit that changes an operation timing of the sub word lines in accordance with a level of the fourth potential.

2. The semiconductor device as claimed in claim 1, wherein the timing adjustment circuit includes a first level conversion circuit that converts a level of the timing signal into the fourth potential.

3. The semiconductor device as claimed in claim 2, wherein
the word driver includes a main word driver that generates a main word signal based on the timing signal and a sub word driver that drives the sub word lines based on at least the main word signal, and
the main word driver includes the first level conversion circuit, a second level conversion circuit that converts the level of the timing signal having the fourth potential into a fifth potential higher than the fourth potential, and a logic circuit that generates the main word signal having an amplitude ranging from the first potential to the fifth potential based on the timing signal having the fifth potential.

4. The semiconductor device as claimed in claim 3, wherein the sub word driver drives selected one of the sub word lines to the fifth potential when the main word signal is in the first potential.

5. The semiconductor device as claimed in claim 4, wherein the sub word driver drives non-selected ones of the sub word lines to a sixth potential lower than the first potential when the main word signal is in the fifth potential.

6. The semiconductor device as claimed in claim 5, wherein
the timing signal includes first and second timing signals that transit in this order, and
the sub word driver includes a first transistor that drives an associated one of the sub word lines to the first potential in response to a transition of the first timing signal and a second transistor that drives the associated one of the sub word lines to the sixth potential in response to a transition of the second timing signal.

7. The semiconductor device as claimed in claim 6, wherein
the timing signal includes a third timing signal that transits later than the second timing signal, and
the sub word driver further includes a third transistor that drives the associated one of the sub word lines to the sixth potential in response to a transition of the third timing signal.

8. A device comprising:
a terminal supplied with a first voltage from outside of the device,
first and second bit lines;
a word line;
an equalizing circuit coupled between the first and second bit lines and including a control node, the equalizing circuit connecting the first and second bit lines to each other when the first voltage is supplied to the control node thereof, and
a word line drive circuit that drives the word line, the word line drive circuit including a first circuit section that operates on the first voltage.

9. The device as claimed in claim 8, further comprising a voltage generator receiving the first voltage and generates second and third voltages in response to the first voltage, the second voltage being lower in level than the first voltage, the third voltage being higher in level than the first voltage, and wherein the word line drive circuit further includes a second circuit section that operates on the second voltage and a third circuit section that operates on the third voltage.

10. The device as claimed in claim 9, wherein the first circuit section of the word line drive circuit receives a first signal supplied from the second circuit section of the word line drive circuit and supplies a second signal generated in response to the first signal to the third circuit section of the word line drive circuit, and the third circuit section of the word line drive circuit drives the word line in response to the second signal.

11. The device as claimed in claim 8, wherein the equalizing circuit includes first and second transistors that are coupled in series between the first and second bit lines and are coupled to each other at a first node, and control electrodes of the first and the second transistors are coupled in common to the control node of the equalizing circuit.

12. The device as claimed in claim 11, wherein the first node of the equalizing circuit is supplied with a second voltage that is lower than the first voltage.

13. A device comprising:
    first and second bit lines;
    a word line;
    an amplifier circuit coupled between the first and second bit lines and driving, when activated, one of the first and second bit lines to a first voltage and the other of the first and second bit lines to a second voltage higher than the first voltage;
    a first control circuit operating on a third voltage that is higher than the second voltage and generating an equalizing signal taking one of the first voltage and the third voltage;
    an equalizing circuit coupled between the first and second bit lines and including a control node receiving the equalizing signal, the equalizing circuit disconnecting the first and second bit lines from each other when the equalizing signal takes the first voltage and connecting the first and second bit lines to each other when the equalizing signal takes the third voltage; and
    a word line drive unit activating or deactivating the word line, the word line drive unit deactivating the word line at a timing depending on a variation of the third voltage.

14. The device as claimed in claim 13, further comprising a second control circuit operating on a fourth voltage that is higher than the first voltage and is lower than the third voltage, the second control circuit supplying the word line drive unit with a first control signal taking one of the first voltage and the fourth voltage, and wherein the word line drive unit includes a first level conversion circuit that converts a level of the first control signal from the fourth voltage to the third voltage when the first control signal taking fourth voltage is supplied to the first level conversion circuit.

15. The device as claimed in claim 13, wherein the word line drive unit activates the word line so that the word line takes a fourth voltage higher than the third voltage.

16. The device as claimed in claim 13, wherein the word line drive unit deactivates the word line so that the word line takes a fourth voltage lower than the first voltage.

17. The device as claimed in claim 13, further comprising a first terminal receiving an external power supply voltage as the third voltage.

18. The device as claimed in claim 13, wherein the equalizing circuit includes first and second transistors that are coupled in series between the first and second bit lines and are coupled to each other at a first node, and control electrodes of the first and the second transistors are coupled in common to the control node of the equalizing circuit.

19. The device as claimed in claim 18, wherein the first node of the equalizing circuit is supplied with a fourth voltage that is higher than the first voltage and is lower than the second voltage.

20. The device as claimed in claim 19, wherein the equalizing circuit further includes a third transistor coupled in parallel to the first and the second transistor between the first and second bit lines and a control electrode of the third transistor is coupled to the control node of the equalizing circuit.

* * * * *